(12) United States Patent
Wang et al.

(10) Patent No.: US 11,050,386 B2
(45) Date of Patent: Jun. 29, 2021

(54) INVERSE PSEUDO FULLY-DIFFERENTIAL AMPLIFIER HAVING COMMON-MODE FEEDBACK CONTROL CIRCUIT

(71) Applicants: BEIJING SMARTCHIP MICROELECTRONICS TECHNOLOGY COMPANY LIMITED, Beijing (CN); STATE GRID INFORMATION & TELECOMMUNICATION GROUP CO., LTD, Beijing (CN); State GRID CORPORATION OF CHINA, Beijing (CN)

(72) Inventors: Yubo Wang, Beijing (CN); Xiaoke Tang, Beijing (CN); Yi Hu, Beijing (CN); Dejian Li, Beijing (CN); Jin Shao, Beijing (CN); Xi Feng, Beijing (CN); Wennan Feng, Beijing (CN); Jiali Hou, Beijing (CN)

(73) Assignee: BEIJING SMARTCHiP MICROELECTRONICS TECHNOLOGY COMP, Beijing (CN)

( * ) Notice: Subject to any disclaimer, the term of this patent is extended or adjusted under 35 U.S.C. 154(b) by 0 days.

(21) Appl. No.: 16/965,342

(22) PCT Filed: Jul. 3, 2019

(86) PCT No.: PCT/CN2019/094624
§ 371 (c)(1),
(2) Date: Jul. 28, 2020

(87) PCT Pub. No.: WO2020/143197
PCT Pub. Date: Jul. 16, 2020

(65) Prior Publication Data
US 2021/0013834 A1     Jan. 14, 2021

(30) Foreign Application Priority Data

Jan. 8, 2019    (CN) .......................... 201910015848.4

(51) Int. Cl.
*H03F 1/02*  (2006.01)
*H03F 3/45*  (2006.01)

(52) U.S. Cl.
CPC ....... *H03F 1/0205* (2013.01); *H03F 3/45269* (2013.01); *H03F 2200/129* (2013.01); *H03F 2203/45116* (2013.01)

(58) Field of Classification Search
CPC ............... H03F 1/0205; H03F 3/45269; H03F 2200/129; H03F 2203/45116
(Continued)

(56) References Cited

U.S. PATENT DOCUMENTS 6,624,698 B2 * 9/2003 Nagaraj .................. H03F 3/005
                                                    330/253
7,161,435 B2    1/2007 Konno
(Continued)

FOREIGN PATENT DOCUMENTS

| CN | 101043206 A | 9/2007 |
|---|---|---|
| CN | 101272131 A | 9/2008 |

(Continued)

OTHER PUBLICATIONS

International Search Report and English Translation as cited in the international application No. PCT/CN2019/094624, dated Oct. 14, 2019, 5 pages.
(Continued)

*Primary Examiner* — Hieu P Nguyen
(74) *Attorney, Agent, or Firm* — Cooper Legal Group, LLC (57) ABSTRACT

An inverse pseudo fully-differential amplifier having a common-mode feedback control circuit and a method for main-
(Continued)

taining a stable output common-mode level are provided. The inverse pseudo fully-differential amplifier includes the pseudo fully-differential operation circuit and a common-mode feedback control circuit. The pseudo fully-differential operation circuit includes inverter amplifiers (2) and (3). The inverter amplifiers (2) and (3) respectively have a first feedback control terminal and a second feedback control terminal. Input terminals of the common-mode feedback control circuit are respectively connected with output terminals of the inverter amplifier (2) and (3), and are configured to detect common-mode output voltages of the inverter amplifier (2) and (3). An output terminal of the common-mode feedback control circuit is connected with the first feedback control terminal and the second feedback control terminal, and is configured to generate common-mode feedback to the inverter amplifiers (2) and (3) to maintain a stable common mode output level.

10 Claims, 2 Drawing Sheets

(58) Field of Classification Search
USPC .................................................. 330/252–261
See application file for complete search history.

(56) References Cited

U.S. PATENT DOCUMENTS

| | | | |
|---|---|---|---|
| 7,701,292 B2 | 4/2010 | Lin | |
| 8,723,597 B2 * | 5/2014 | Han | H03H 19/004 330/9 |
| 2006/0197606 A1 | 9/2006 | Konno | |
| 2008/0224779 A1 | 9/2008 | Lin | |
| 2009/0179699 A1 | 7/2009 | Higuchi | |
| 2009/0185406 A1 | 7/2009 | Uno | |
| 2016/0359463 A1 | 12/2016 | Kurose et al. | |

FOREIGN PATENT DOCUMENTS

| | | | |
|---|---|---|---|
| CN | 101621292 A | 1/2010 | |
| CN | 102687392 A | 9/2012 | |
| CN | 103219961 A | 7/2013 | |
| CN | 104333386 A | 2/2015 | |
| CN | 106788278 A | 5/2017 | |
| CN | 206620104 U | 11/2017 | |
| CN | 109743032 A | 5/2019 | |
| EP | 1564949 A1 | 8/2005 | |

OTHER PUBLICATIONS

Written Opinion and English translation of the International Search Authority in the international application No. PCT/CN2019/094624, dated Oct. 14, 2019, 8 pages.

First Office Action and English Translation of the Chinese application No. 201910015848.4, dated May 7, 2020, 18 pages.

Moosazadeh et al. "A pseudo-differential MDAC with gain-boosting inverter for pipelined ADCs", <Analog Integrated Circuits and Signal Processing>, vol. 79, issued on Dec. 25, 2013, pp. 255-266.

Hou, Jiali et al. "Design of integrated multi-mode reference voltage generator for SAR ADC", <Microelectronic Technology>, vol. 44, Issue 7, Issued on Jul. 6, 2018, pp. 34-37.

Notice of Allowance of the Chinese application No. 201910015848.4, dated Aug. 3, 2020, 4 pgs.

* cited by examiner

INVERSE PSEUDO FULLY-DIFFERENTIAL AMPLIFIER HAVING COMMON-MODE FEEDBACK CONTROL CIRCUIT

CROSS-REFERENCE TO RELATED APPLICATION

The present application is based upon and claims priority to Chinese Patent Application No. 201910015848.4 filed on Jan. 8, 2019, the content of which is hereby incorporated by reference in its entirety.

TECHNICAL FIELD

The present disclosure relates to, but is not limited to, the field of the design of a low-voltage and low-power circuit, and particularly to an inverse pseudo fully-differential amplifier having a common-mode feedback control circuit, and a method for maintaining a stable output common-mode level.

BACKGROUND

Full-differential amplifiers are widely applied in the application field of high-precision analog circuits, such as the processing field of data converters, the processing field for sensor signals and small signals. The full-differential amplifiers have the characteristics of strong anti-interference ability and large swing of processing signal. Due to deviations caused during producing and fabrication of devices, it is impossible to achieve 100% matching between devices, and further it is difficult to determine an output common-mode level of the amplifier, which results in disadvantageous effects that the amplifier enters a dead zone and a signal processing range is greatly reduced. Therefore, a common-mode feedback circuit is required for the full-differential amplifier to maintaining a stable output common-mode level of the full-differential amplifier. The full-differential operation amplifier has relatively mature common-mode feedback schemes, which includes a continuous-time common-mode feedback control circuit and a common-mode feedback circuit based on a switched capacitor.

In the field of low-voltage and low-power data acquisition, since the power supply of the chip may be micro battery, wireless power supply or the like, the power energy and power voltage obtained by the chip are not sufficient. Therefore, the chip must be able to operate with very low power consumption at a low voltage situation. The full-differential amplifier must also operate normally with very low power consumption at a low operation voltage which is often below 0.8V. In this application situation, the full-differential amplifier circuit and the common-mode feedback circuit thereof cannot meet application requirements of low voltage and low power consumption.

The information disclosed in the background part is only intended to improving understanding of the background of the disclosure, and is not regarded as an acknowledgement or suggestion in any way that the information constitutes prior art that is well known to those of ordinary skill in the art.

SUMMARY

In view of this, the embodiments of the present disclosure aims to provide an inverse pseudo fully-differential amplifier having a common-mode feedback control circuit, which can stabilize an output common-mode level in low-voltage and low-power application scenarios.

The present disclosure provides an inverse pseudo fully-differential amplifier having a common-mode feedback control circuit, which includes a pseudo fully-differential operation circuit and a common-mode feedback control circuit (1). The pseudo fully-differential operation circuit includes a first inverter amplifier (2) and a second inverter amplifier (3). The first inverter amplifier (2) has a first feedback control terminal, and the second inverter amplifier (3) has a second feedback control terminal. Input terminals of the common-mode feedback control circuit (1) are respectively connected with an output terminal of the first inverter amplifier (2) and an output terminal of the second inverter amplifier (3), and an output terminal of the common-mode feedback control circuit (1) is connected with the first feedback control terminal and the second feedback control terminal. The common-mode feedback control circuit (1) is configured to detect common-mode output voltages of the first inverter amplifier (2) and the second inverter amplifier (3) and generate a feedback control signal. The feedback control signal is inputted to the first feedback control terminal and the second feedback control terminal to regulate gains of the first inverter amplifier (2) and the second inverter amplifier (3), to regulate the common-mode output voltages.

In the above solution, the pseudo fully-differential operation circuit further includes a switch (SW9), a switch (SW10), a capacitor (8) and a capacitor (9). An upper plate of the capacitor (8) is connected with a first input signal, and a lower plate of the capacitor (8) is connected with an input terminal of the first inverter amplifier (2). The switch (SW9) is connected in parallel with the first inverter amplifier (2). An upper plate of the capacitor (9) is connected with a second input signal, and a lower plate of the capacitor (9) is connected with an input terminal of the second inverter amplifier (3), and the switch (SW10) is connected in parallel with the second inverter amplifier (3).

In the above solution, the pseudo fully-differential operation circuit further includes a switch (SW7), a switch (SW8), a capacitor (6) and a capacitor (7). One end of the switch (SW7) is connected with an upper plate of the capacitor (6), a lower plate of the capacitor (6) is connected with the output terminal of the first inverter amplifier (2), and the other end of switch (SW7) is connected with the upper plate of the capacitor (8). One end of the switch (SW8) is connected with an upper plate of the capacitor (7), a lower plate of the capacitor (7) is connected with the output terminal of the second inverter amplifier (3), and the other end of switch (SW8) is connected with the upper plate of the capacitor (9).

In the above solution, the inverse pseudo fully-differential amplifier further includes an input signal sampling circuit, which is configured to provide a first input signal and a second input signal to the pseudo fully-differential operation circuit.

In the above solution, the input signal sampling circuit includes a switch (SW1), a switch (SW2), a switch (SW3), a switch (SW4), a switch (SW5), a switch (SW6), a capacitor (4) and a capacitor (5). The switch (SW1) and the switch (SW3) are all connected with an upper plate of the capacitor (4). The switch (SW2) and the switch (SW4) are all connected with an upper plate of the capacitor (5). The other ends of the switch (SW1) and the switch (SW2) are respectively connected with a first sampling circuit input signal (VIN) and a second sampling circuit input signal (VIP). A lower plate of the capacitor (4) is connected with the switch (SW5), and a lower plate of the capacitor (5) is connected with the switch (SW6). The other ends of the switch (SW5), the switch (SW6), the switch (SW3) and the switch (SW4) are connected with the same level. The lower plate of the capacitor (4) outputs the first input signal and the lower plate of the capacitor (5) outputs the second input signal.

In the above solution, the first inverter amplifier (2) has the same circuit as that of the second inverter amplifier (3), the circuit of the inverter amplifier includes a Positive Channel Metal Oxide Semiconductor (PMOS) transistor (M1), a PMOS transistor (M2), a N-Metal Oxide Semiconductor (NMOS) transistor (M3), a NMOS transistor (M4), a switch (P1), a switch (P2), a switch (P3), a switch (P4), a voltage source (I1) and a voltage source (I2). A source of the PMOS transistor (M1) is the input terminal of the inverter amplifier, and an output terminal of the voltage source (I2) is the output terminal of the circuit of the inverter amplifier. A drain and a gate of the PMOS transistor (M1) are connected through the switch (P3). A source and a gate of the NMOS transistor (M4) are connected through the switch (P4). The gates of the PMOS transistor (M2) and the NMOS transistor (M3) are respectively connected with a reference voltage (VB1) and a reference voltage (VB2). During an input signal sampling stage, the switch (P1), the switch (P2), the switch (P3), and the switch (P4) are all in turn-on state, a current of the PMOS transistor (M1) flows through the voltage source (I1), a current of the NMOS transistor (M4) flows through the voltage source (I2), and the PMOS transistor (M2) and the NMOS transistor (M3) are both in an off state. During an input signal amplifying stage, the switch (P1), the switch (P2), the switch (P3), the switch (P4) are all in turn-off state, the PMOS transistor (M1), the PMOS transistor (M2), the NMOS transistor (M3) and the NMOS transistor (M4) constitute a class AB amplifier which is configured to amplify an output current.

In the above solution, each of the feedback control terminals of the first inverter amplifier (2) and the second inverter amplifier (3) is led out from the gate of the NMOS transistor (M4).

In the above solution, the common-mode feedback control circuit (1) includes a switch (SW11), a switch (SW12), a switch (SW13), a switch (SW14), a capacitor (C10) and a capacitor (C11). One end of the switch (SW11) is connected with the output terminal of the first inverter amplifier (2), one end of the switch (SW12) is connected with the output terminal of the second inverter amplifier (3), the other end of the switch (SW11) is connected with an upper plate of the capacitor (C10), the other end of the switch (SW12) is connected with an upper plate of the capacitor (C11), a lower plate of the capacitor (C10) and a lower plate of the capacitor (C11) are connected together and then respectively connected with the first feedback control terminal of the first inverter amplifier (2) and the second feedback control terminal of the second inverter amplifier (3), to constitute a detection circuit for common-mode output voltages of the inverter amplifier (2) and the inverter amplifier (3). One end of the switch (SW13) is connected with the upper plate of the capacitor (C10), one end of the switch (SW14) is connected with the upper plate of the capacitor (C11), the other end of the switch (SW13) is connected with a common-mode reference voltage (Vcm), and the other end of the switch (SW14) is connected with a common-mode reference voltage (Vcm), to constitute a comparison circuit for common-mode output voltages.

In the above solution, the common-mode feedback control circuit (1) further includes a switch (SW15) and a switch (SW16). One end of the switch (SW15) is connected with the output terminal of the inverter amplifier (2), and one end of the switch (SW16) is connected with the output terminal of the inverter amplifier (3). Each of the other end of the switch (SW15) and the other end of the switch (SW16) is connected with the common-mode reference voltage (Vcm), to constitute an auxiliary common-mode feedback circuit.

The present disclosure further provides a method for maintaining a stable output common-mode level by using the above reverse pseudo fully-differential amplifier, which including operations as follows.

The common-mode feedback control circuit (1) detects common-mode output voltages of the first inverter amplifier (2) and the second inverter amplifier (3) of the pseudo fully-differential operational circuit.

The common-mode feedback control circuit (1) generates a feedback control signal according to the common-mode output voltages, and the feedback control signal is inputted to the first feedback control terminal and the second feedback control terminal to regulate gains of the first inverter amplifier (2) and the second inverter amplifier (3), to regulate the common-mode output voltages.

With the above embodiments of the present disclosure, in the pseudo fully-differential amplifier circuit having a common-mode feedback control circuit according to the present disclosure, the cooperation of the common-mode feedback control circuit and the inverse amplifier enables the pseudo differential operation amplifier based on the inverse amplifier to have a stable output common-mode level, and to have little dependence on the deviation of the process, so that the circuit can be applied in a wide temperature range from −40° C. to 85° C., thereby improving the manufacturing yield. Also, the pseudo fully-differential operation amplifier based on the inverter is practical and can be applied in low-voltage and low-power application situations, the power supply voltage can be reduced to less than 0.8V, and the power consumption can be reduced to a level of hundreds of nanoamps, which expands the application range of the conventional fully-differential operation amplifier. The designed auxiliary common-mode feedback circuit allows the common-mode feedback control circuit to assign an initial voltage to a high-impedance node of the circuit without consuming additional current, thereby improving a response speed of the circuit under low-power operation conditions, making the response speed controllable, and reducing the difficulty of design of auxiliary circuits for using this circuit.

DETAILED DESCRIPTION

The specific embodiments of the present disclosure are described below in detail in combination with the accompanying drawings. It should be understood that the scope of protection of the disclosure is not limited by the specific embodiments.

Unless other explicit representations, the terms "include" or the variations thereof like "comprise" or "including" in the whole specification and claims will be understood as including the stated elements or components, but no excluding other elements or other components.

An inverse pseudo fully-differential amplifier having a common-mode feedback control circuit is provided in the present disclosure. The common-mode feedback control circuit successfully maintains an output common-mode level of the inverse pseudo fully-differential amplifier, which can ensure normal operation of a second-order Sigma-Delta ADC implemented using the amplifier.

Figure 1:
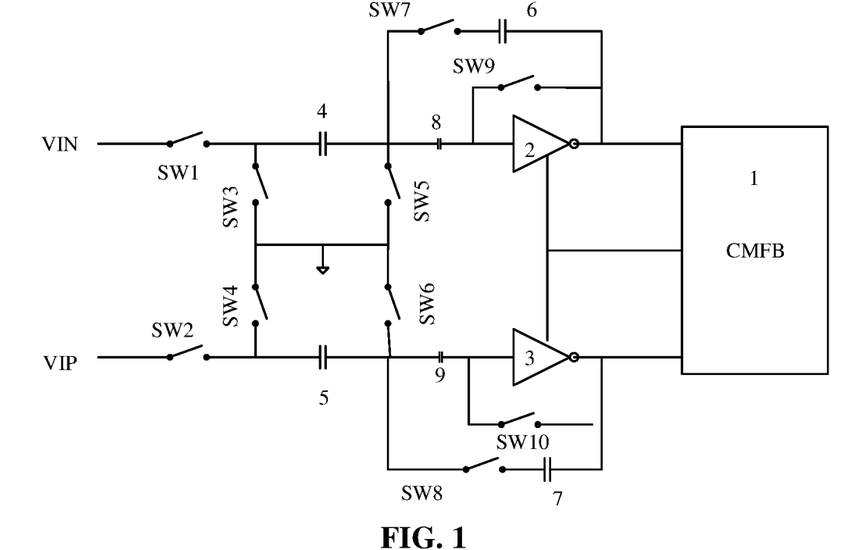
FIG. 1 shows a whole structure of a pseudo fully-differential amplifier having a common-mode feedback control circuit provided by an embodiment of the present disclosure.

FIG. 1 showing a whole structure of a pseudo fully-differential amplifier having a common-mode feedback control circuit provided by an embodiment of the present disclosure.

In order to reduce power consumption and realize low-voltage applications, a switch and capacitor structure is used to realize an amplification processing function of a signal. The pseudo fully-differential amplifier includes a common-mode feedback circuit 1 (CMFB1), inverter amplifiers 2 and 3, capacitors 4, 5, 6, 7, 8 and 9, and switches SW1 to SW10.

The switches SW1 and SW3 are connected with an upper plate of the capacitor 4, and the switches SW2 and SW4 are connected with an upper plate of the capacitor 5, to constitute input signals for phase amplification. The other ends of the switches SW1 and SW2 are respectively connected with the input signals VIN and VIP. A lower plate of the capacitor 4 is connected with the switch SW5, and a lower plate of the capacitor 5 is connected with the switch SW6. The other ends of the switches SW5, SW6, SW3 and SW4 are all connected with the same level, to constitute an input signal sampling circuit.

A lower plate of the capacitor 8 is connected with an input terminal of the inverter amplifier 2, and a lower plate of the capacitor 9 is connected with an input terminal of the inverter amplifier 3. One end of the switch SW9 is connected with the lower plate of the capacitor 8 and the input terminal of the inverter amplifier 2, and one end of the switch SW10 is connected with the lower plate of the capacitor 9 and the input terminal of the inverter amplifier 3, to constitute a pseudo differential operation amplifier.

One end of the switch SW7 is connected with the lower plate of the capacitor 4, and one end of switch SW8 is connected with the lower plate of the capacitor 5. The other end of the switch SW7 is connected with an upper plate of the capacitor 6, and the other end of the switch SW8 is connected with an upper plate of the capacitor 7, A lower plate of the capacitor 6 is connected with the other end of the switch SW9 and an output terminal of the inverter amplifier 2, and a lower plate of the capacitor 7 is connected with the other end of the switch SW10 and an output terminal of the inverter amplifier 3, to constitute an amplification part of the amplifier.

The output terminal of the inverter amplifier 3 and the output terminal of the inverter amplifier 2 are respectively connected with the two input terminals of the common-mode feedback circuit 1, and an output signal of the common-mode feedback circuit 1 directly controls gains of the inverter amplifier 2 and the inverter amplifier 3 to realize the function of common-mode feedback.

A main purpose of the common-mode feedback circuit 1 (CMFB1) is to detect the common-mode output voltages of the inverter amplifier 2 and the inverter amplifier 3 in the phase amplification stage, and generate a feedback control signal, to control bias circuits of the inverter amplifier 2 and the inverter amplifier 3, thereby regulating the common-mode output voltages to an appropriate level.

The implementation methods of the common-mode feedback circuit are different for different implementation methods of inverter amplifier 2.

Figure 2:
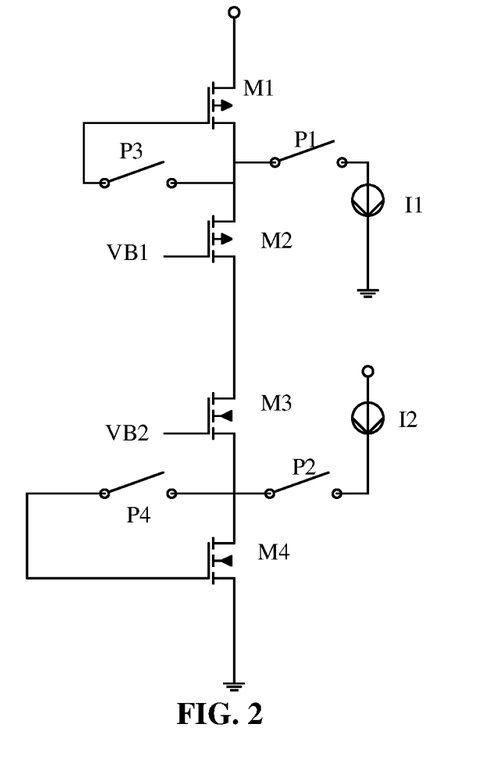
FIG. 2 shows an inverter amplifier provided by an embodiment of the present disclosure.

FIG. 2 shows an inverter amplifier provided by an embodiment of the present disclosure. The gates of M2 and M3 are respectively connected with the reference voltages VB1 and VB2. In a sampling stage, switches P1, P2, P3 and P4 are all in the turn-on state. A current of M1 flows through the voltage source I1, and a current of M4 flows through the voltage source I2. M1 and M4 are configured to be in a diode-connected state, and bias voltages of the gates of M1 and M4 are determined. In this case, M2 and M3 are all in a cut-off state. In an amplification stage, P1, P2, P3 and P4 are all in the turn-off state, M1, M2, M3 and M4 constitute a class AB amplifier, which can provide a large output current and swing rate.

Figure 3:
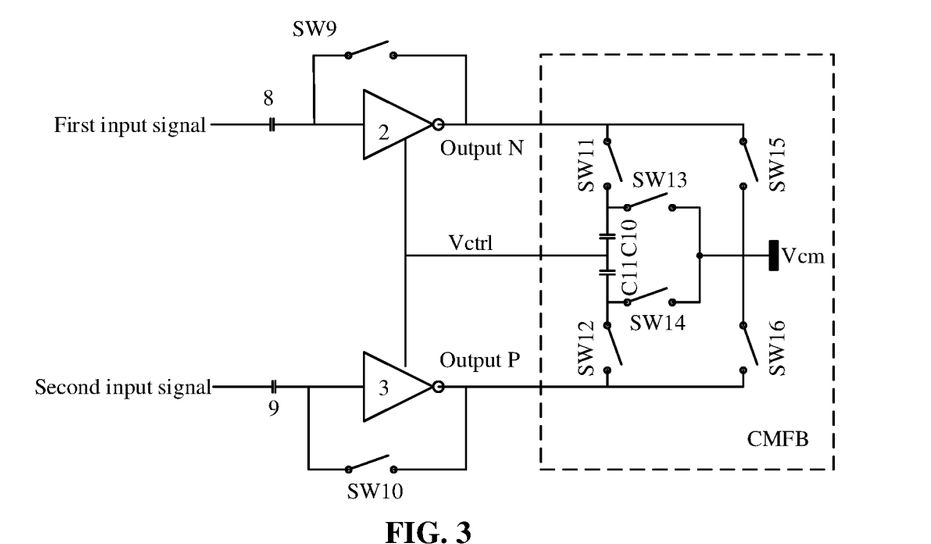
FIG. 3 shows a common-mode feedback control circuit provided by an embodiment of the present disclosure.

FIG. 3 shows a common-mode feedback control circuit provided by an embodiment of the present disclosure. The part outlined by the dotted lines in FIG. 3 is an implementation scheme of the common-mode feedback circuit.

In the common-mode feedback circuit, a common-mode control voltage Vctrl of intermittent operation is generated through a common-mode node sampling and comparing circuit composed of switches SW11, SW12, SW13, SW14, SW15 and SW16 and capacitors C10 and C11.

One end of the switch SW11 is connected with the output terminal of the inverter amplifier 2, and one end of the switch SW12 is connected with the output terminal of the inverter amplifier 3. The other end of the switch SW11 is connected with an upper plate of the capacitor C10, and the other end of the switch SW12 is connected with an upper plate of the capacitor C11. The lower plate of the capacitor C10 and the lower plate of capacitor C11 are connected together, to constitute a detection circuit for common-mode output voltages of the inverter amplifier.

One end of the switch SW13 is connected with the upper plate of the capacitor C10, and one end of the switch SW14 is connected with the upper plate of the capacitor C11. The other end of the switch SW13 is connected with the common-mode reference voltage Vcm, and the other end of the switch SW14 is connected with the common-mode reference voltage Vcm, to constitute a comparison circuit for the common-mode feedback.

In some embodiments, one end of the switch SW15 is connected with the output of the inverter amplifier 2, one end of the switch SW16 is connected with the output of the inverter amplifier 3. The other end of the switch SW15 and the other end of switch SW16 are connected with the common-mode reference voltage Vcm, to constitute an auxiliary common-mode feedback circuit.

Figure 4:
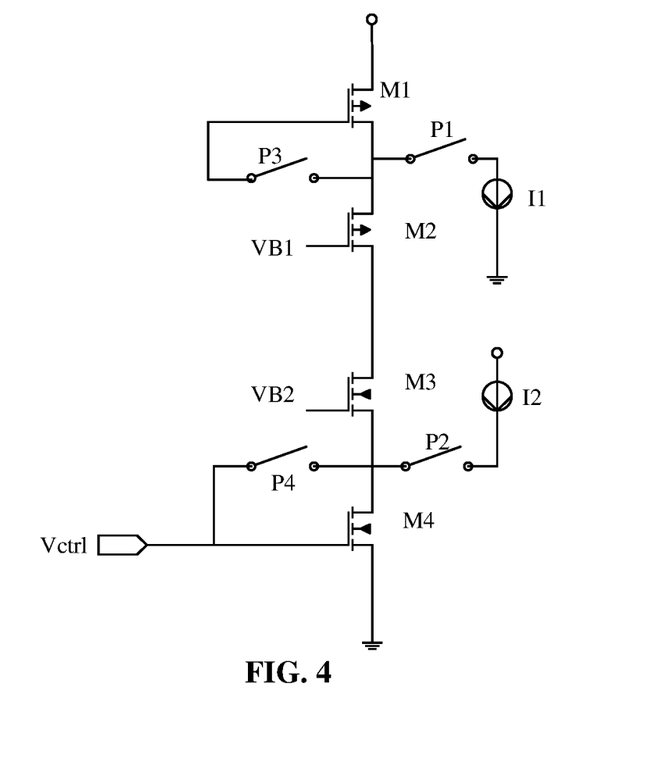
FIG. 4 is a schematic diagram of a connection mode of an inverter amplifier and a common-mode feedback control circuit provided by an embodiment of the present disclosure.

FIG. 4 is a schematic diagram of a connection mode of the above inverter amplifier and the above common-mode feedback control circuit. The gate of M4 in the amplifier is led out as a common-mode feedback control port Vctrl, which is directly connected with the output terminal of Vctrl of the common-mode feedback network (CMFB). In combination of FIG. 3 and FIG. 4, a complete pseudo fully-differential amplifier circuit having a common-mode feedback control circuit is implemented. The circuit can operate normally and keep a common output voltage of the circuit near Vcm under deviation conditions of all process fabrications and a wide temperature range, thereby ensuring that the amplifier can output a suitable output swing and the function of the circuit is correctly implemented.

The pseudo fully-differential amplifier circuit having the common-mode feedback control circuit shown in FIG. 3 and FIG. 4 is composed of the common-mode feedback control circuit 1 (CMFB) and the inverter amplifiers 2 and 3 having feedback control terminals. The output of the common-mode feedback control circuit 1 (CMFB) is connected with the feedback control terminals of the inverter amplifiers 2 and 3, to form a complete common-mode output feedback loop. The feedback control terminals of the inverter amplifiers 2 and 3 having the feedback control terminals are led out from the gate of the NMOS tube M4 of the inverter amplifier. A relationship between a control signal and the output signal of the inverter amplifier is inverse amplification, and the phase difference between the control signal and the output signal is 180 degrees.

The common-mode feedback control circuit 1 (CMFB) is composed of switches SW11 to SW16 and capacitors C10 and C11. The common-mode reference voltage sampling circuit is composed of SW13 and SW14 and capacitors C10 and C11. During the common-mode reference voltage sampling stage, switches SW13 and SW14 are in the turn-on state, the voltages of the upper plates of C10 and C11 is Vcm, the voltage Vctrl of the lower plate is connected with the gates of the NMOS transistors M4 in the inverter amplifiers 2 and 3. At this stage, the switches P1 to P4 in the inverter amplifiers 2 and 3 are also in the turn-on state. Therefore, Vctrl=Vgs4, and the output of the inverter amplifier is in a high-impedance state, and the inverter amplifier has no amplification effect. Therefore, the voltages of the lower plates of C10 and C11 at this stage are Vgs4, the amount of charge stored in this node is represented as:

$$Qsample=(Vcm-Vgs4)*C10+(Vcm-Vgs4)*C11$$

In an embodiment, C10=C11, then, $$Qsample=2*(Vcm-Vgs4)*C10$$

The switches SW11 and SW12 and the capacitors C10 and C11 constitute a circuit for common-mode output voltage detection and error signal output of the pseudo differential amplifier. During a common-mode voltage feedback stage, the switches SW11 and SW12 are turned on, the switches SW13 and SW14 are turned off, and the upper plates of capacitors C10 and C11 are respectively connected with the output voltages OUTN (output N) and OUTP (output P) of the inverter amplifiers 2 and 3, to implement sampling of the common-mode output voltage. In this case, the amount of the electric charge of the capacitors C10 and C11 is represented as:

$$Q10amp=(Voutn-Vctrl)*C10$$

$$Q11amp=(Voutp-Vctrl)*C11$$

The total charge stored in the lower plates of C10 and C11 is represented as:

$$Qamp=(Voutn-Vctrl)*C10+(Voutp-Vctrl)*C11$$

If C10=C11, Qamp=(Voutn+Voutp−2Vctrl)*C10

According to the conservation law of charge, Qsample=Qamp, $$2*(Vcm-Vgs4)*C10=(Voutn+Voutp-2Vctrl)*C10$$

Therefore, Vctrl−Vgs4=(Voutn+Voutp−2Vcm)/2.

At this stage, the switches P1 to P4 of the inverter amplifiers 2 and 3 are all turned off, the inverter amplifier is in an amplifying state to amplify alternating-current signals outputted from the gates of the transistors M4 and M1. In this case, the transistor M4 amplifies the outputted common-mode error signal Vctrl−Vgs4, thereby realizing common-mode feedback. Preferably, the switches SW15 and SW16 constitute an auxiliary common-mode feedback circuit. During the common-mode reference voltage sampling stage, the switches SW15 and SW16 are turned on, and the inverter amplifiers 2 and 3 are in an off state, and no amplifier function can be realized. The output voltages OUTN and OUTP are high-impedance nodes. The switches SW15 and SW16 pull both OUTN and OUTP to a specified common-mode voltage VCM, so that an initial value of an output voltage of the inverter amplifier in the amplification phase stage is hold at VCM, thereby improving a response speed. This is extremely important in a low-voltage and low-power application scenario. The common-mode sampling capacitors C10 and C11 may be of the same size or different sizes. The chip is not limited to have only one fixed voltage therein, and the voltage may be selected according to different requirements for a common-mode output voltage of the pseudo differential amplifier.

In the above pseudo fully-differential amplifier circuit having a common-mode feedback control circuit, the cooperation of the common-mode feedback control circuit 1 and the inverse amplifier 2 and 3 enables the pseudo differential operation amplifier based on the inverse amplifier to have a stable output common-mode level, and to have little dependence on the deviation of the process, so that the circuit can be applied in a wide temperature range from −40° C. to 85° C., thereby improving the manufacturing yield. Also, the pseudo fully-differential operation amplifiers based on the inverter are practical and can be applied in low-voltage and low-power application situations, the power supply voltage can be reduced to less than 0.8V, and the power consumption can be reduced to a level of hundreds of nanoamps, which expands an application range of the conventional fully-differential operational amplifier. The designed auxiliary common-mode feedback circuit allows the common-mode feedback control circuit 1 to assign an initial voltage to the high-impedance node of the circuit without consuming additional current, thereby improving a response speed of the circuit under a low-power operation condition, making a response speed controllable, and reducing difficulty of design of auxiliary circuits for using this circuit.

Those skilled in the art should understand that the embodiments of the present disclosure may be implemented as methods, systems, or computer program products. Therefore, the present disclosure may be in the form of a complete-hardware embodiment, a complete-software embodiment, or an embodiment of combining software and hardware. Moreover, the present disclosure may be in the form of a computer program product implemented on one or more computer usable storage medias (including but not limited to a disk storage, a CD-ROM, an optical storage, etc.) containing computer usable program codes.

This disclosure is described with reference to the flowcharts and/or block diagrams of methods, devices (systems) and computer program products according to the embodiments of the disclosure. It should be understood that each flow and/or block in the flowchart and/or block diagram and a combination of flows and/or blocks in the flowchart and/or block diagram may be implemented by computer program instructions. These computer program instructions can be provided to the processor of a general-purpose computer, a special-purpose computer, an embedded processor, or other programmable data processing device to produce a machine that allows instructions executed by the processor of the computer or other programmable data processing device to generate a device for implementing functions specified in one or more flows of a flowchart and/or one or more blocks of the block diagram.

These computer program instructions may also be stored in a computer-readable memory that can direct a computer or other programmable data processing device to operate in a specific manner, and thus the instructions stored in the computer-readable memory produce an article of manufacture including an instruction device The instruction device implements the functions specified in one or more flows of the flowchart and/or one or more blocks of the block diagram.

These computer program instructions can also be loaded onto a computer or other programmable data processing device, so that a series of operations steps are performed on the computer or other programmable device to produce computer-implemented processing. Therefore, the instructions executed on the computer or other programmable device provide steps for implementing the functions specified in one or more flows of a flowchart and/or one or more blocks of the block diagram.

The above description for specific exemplary embodiments of the present disclosure is used for the purposes of illustration and description. These descriptions are not intended to limit the present disclosure to the disclosed precise form, and it is clear that many changes and modifications can be made in accordance with the above teachings. The purpose of selecting and describing the exemplary embodiments is to explain specific principles of this disclosure and practical applications thereof, so that those skilled in the art can implement and utilize various exemplary embodiments of the present disclosure and various choices and changes. The scope of the disclosure is intended to be defined by the claims and their equivalents.

The invention claimed is:

1. An inverse pseudo fully-differential amplifier having a common-mode feedback control circuit, comprising:
    a pseudo fully-differential operation circuit comprising a first inverter amplifier and a second inverter amplifier, wherein the first inverter amplifier has a first feedback control terminal, and the second inverter amplifier has a second feedback control terminal;
    the common-mode feedback control circuit, wherein input terminals of the common-mode feedback control circuit are respectively connected with an output terminal of the first inverter amplifier and an output terminal of the second inverter amplifier, an output terminal of the common-mode feedback control circuit is connected with the first feedback control terminal and the second feedback control terminal, and the common-mode feedback control circuit is configured to detect common-mode output voltages of the first inverter amplifier and the second inverter amplifier and generate a feedback control signal, the feedback control signal is inputted to the first feedback control terminal and the second feedback control terminal to regulate gains of the first inverter amplifier and the second inverter amplifier to regulate the common-mode output voltages,
    wherein the pseudo fully-differential operation circuit further comprises a ninth switch, a tenth switch, an eighth capacitor and a ninth capacitor, an upper plate of the eighth capacitor is connected with a first input signal, a lower plate of the eighth capacitor is connected with an input terminal of the first inverter amplifier, and the ninth switch is connected in parallel with the first inverter amplifier, an upper plate of the ninth capacitor is connected with a second input signal, a lower plate of the ninth capacitor is connected with an input terminal of the second inverter amplifier, and the tenth switch is connected in parallel with the second inverter amplifier,
    the first inverter amplifier has a same circuit as that of the second inverter amplifier, and the circuit of the inverter amplifier comprises a first Positive Channel Metal Oxide Semiconductor (PMOS) transistor, a second PMOS transistor, a third N-Metal Oxide Semiconductor (NMOS) transistor, a fourth NMOS transistor, an eleventh switch, a twelfth switch, a thirteenth switch, a fourteenth switch, a first voltage source and a second voltage source; wherein,
    a source of the first PMOS transistor is an input terminal of the circuit of the inverter amplifier, and an output terminal of the second voltage source is an output terminal of the circuit of the inverter amplifier, a drain and a gate of the first PMOS transistor are connected through the thirteenth switch, a source and a gate of the fourth NMOS transistor are connected through the fourteenth switch, a gate of the second PMOS transistor and a gate of the third NMOS transistor are respectively connected with a first reference voltage and a second reference voltage;
    during an input signal sampling phase, the eleventh switch, the twelfth switch, the thirteenth switch and the fourteenth switch are all in a turn-on state, a current of the first PMOS transistor flows through the first voltage source, a current of the fourth NMOS transistor flows through the second voltage source, and the second PMOS transistor and the third NMOS transistor are both in an off state; and
    during an input signal amplifying phase, the eleventh switch, the twelfth switch, the thirteenth switch and the fourteenth switch are all in a turn-off state, the first PMOS transistor, the second PMOS transistor, the third NMOS transistor and the fourth NMOS transistor constitute a class AB amplifier which is configured to amplify an output current.

2. The inverse pseudo fully-differential amplifier having the common-mode feedback control circuit of claim 1, wherein the pseudo fully-differential operation circuit further comprises a seventh switch, an eighth switch, a sixth capacitor and a seventh capacitor, one end of the seventh switch is connected with an upper plate of the sixth capacitor, a lower plate of the sixth capacitor is connected with the output terminal of the first inverter amplifier, and other end of the seventh switch is connected with the upper plate of the eighth capacitor; one end of the eighth switch is connected with an upper plate of the seventh capacitor, a lower plate of the seventh capacitor is connected with the output terminal of the second inverter amplifier, and other end of the eighth switch is connected with the upper plate of the ninth capacitor.

3. The inverse pseudo fully-differential amplifier having the common-mode feedback control circuit of claim 2, further comprising:
    an input signal sampling circuit configured to provide the first input signal and the second input signal for the pseudo fully-differential operation circuit.

4. The inverse pseudo fully-differential amplifier having the common-mode feedback control circuit of claim 3, wherein the input signal sampling circuit comprises a first switch, a second switch, a third switch, a fourth switch, a fifth switch, a sixth switch, a fourth capacitor and a fifth capacitor, the first switch and the third switch are all connected with an upper plate of the fourth capacitor, the second switch and the fourth switch are all connected with an upper plate of the fifth capacitor, other ends of the first switch and the second switch are respectively connected with a first sampling circuit input signal and a second sampling circuit input signal, a lower plate of the fourth capacitor is connected with the fifth switch, a lower plate of the fifth capacitor is connected with the sixth switch, other ends of the fifth switch, the sixth switch, the third switch and the fourth switch are connected with a same level, wherein the lower plate of the fourth capacitor outputs the first input signal, and the lower plate of the fifth capacitor outputs the second input signal.

5. The inverse pseudo fully-differential amplifier having common-mode feedback control circuit of claim 1, wherein each of the first feedback control terminals of the first inverter amplifier and the second feedback control terminal of the second inverter amplifier is led out from the gate of the fourth NMOS transistor.

6. The inverse pseudo fully-differential amplifier having the common-mode feedback control circuit of claim 1, wherein the common-mode feedback control circuit comprises a fifteenth switch, a sixteenth switch, a seventeenth switch, an eighteenth switch, a tenth capacitor and an eleventh capacitor,
wherein one end of the fifteenth switch is connected with the output terminal of the first inverter amplifier, one end of the sixteenth switch is connected with the output terminal of the second inverter amplifier, other end of the fifteenth switch is connected with an upper plate of the tenth capacitor, other end of the sixteenth switch is connected with an upper plate of the eleventh capacitor, a lower plate of the tenth capacitor and a lower plate of the eleventh capacitor are connected together and then respectively connected with the first feedback control terminal of the first inverter amplifier and the second feedback control terminal of the second inverter amplifier, to constitute a detection circuit for the common-mode output voltages of the first inverter amplifier and the second inverter amplifier; and
one end of the seventeenth switch is connected with the upper plate of the tenth capacitor, one end of the eighteenth switch is connected with the upper plate of the eleventh capacitor, other end of the seventeenth switch is connected with a common-mode reference voltage, and other end of the eighteenth switch is connected with the common-mode reference voltage, to constitute a comparison circuit for the common-mode output voltages.

7. The inverse pseudo fully-differential amplifier having the common-mode feedback control circuit of claim 6, wherein the common-mode feedback control circuit further comprises a nineteenth switch and a twentieth switch, one end of the nineteenth switch is connected with the output terminal of the first inverter amplifier, one end of the twentieth switch is connected with the output terminal of the second inverter amplifier, each of other end of the nineteenth switch and other end of the twentieth switch is connected with the common-mode reference voltage, to constitute an auxiliary common-mode feedback circuit.

8. A method for maintaining a stable output common-mode level using the inverse pseudo fully-differential amplifier of claim 1, comprising:
detecting, by the common-mode feedback control circuit, the common-mode output voltages of the first inverter amplifier and the second inverter amplifier of the pseudo fully-differential operation circuit; and
generating, by the common-mode feedback control circuit, the feedback control signal according to the common-mode output voltages.

9. An inverse pseudo fully-differential amplifier having a common-mode feedback control circuit, comprising:
a pseudo fully-differential operation circuit comprising a first inverter amplifier and a second inverter amplifier, wherein the first inverter amplifier has a first feedback control terminal, and the second inverter amplifier has a second feedback control terminal;
the common-mode feedback control circuit, wherein input terminals of the common-mode feedback control circuit are respectively connected with an output terminal of the first inverter amplifier and an output terminal of the second inverter amplifier, an output terminal of the common-mode feedback control circuit is connected with the first feedback control terminal and the second feedback control terminal, and the common-mode feedback control circuit is configured to detect common-mode output voltages of the first inverter amplifier and the second inverter amplifier and generate a feedback control signal, the feedback control signal is inputted to the first feedback control terminal and the second feedback control terminal to regulate gains of the first inverter amplifier and the second inverter amplifier to regulate the common-mode output voltages,
wherein the pseudo fully-differential operation circuit further comprises a ninth switch, a tenth switch, an eighth capacitor and a ninth capacitor, an upper plate of the eighth capacitor is connected with a first input signal, a lower plate of the eighth capacitor is connected with an input terminal of the first inverter amplifier, and the ninth switch is connected in parallel with the first inverter amplifier, an upper plate of the ninth capacitor is connected with a second input signal, a lower plate of the ninth capacitor is connected with an input terminal of the second inverter amplifier, and the tenth switch is connected in parallel with the second inverter amplifier;
the common-mode feedback control circuit comprises a fifteenth switch, a sixteenth switch, a seventeenth switch, an eighteenth switch, a tenth capacitor and an eleventh capacitor;
one end of the fifteenth switch is connected with the output terminal of the first inverter amplifier, one end of the sixteenth switch is connected with the output terminal of the second inverter amplifier, other end of the fifteenth switch is connected with an upper plate of the tenth capacitor, other end of the sixteenth switch is connected with an upper plate of the eleventh capacitor, a lower plate of the tenth capacitor and a lower plate of the eleventh capacitor are connected together and then respectively connected with the first feedback control terminal of the first inverter amplifier and the second feedback control terminal of the second inverter amplifier, to constitute a detection circuit for the common-mode output voltages of the first inverter amplifier and the second inverter amplifier; and
one end of the seventeenth switch is connected with the upper plate of the tenth capacitor, one end of the eighteenth switch is connected with the upper plate of the eleventh capacitor, other end of the seventeenth switch is connected with a common-mode reference voltage, and other end of the eighteenth switch is connected with the common-mode reference voltage, to constitute a comparison circuit for the common-mode output voltages.

10. The inverse pseudo fully-differential amplifier having the common-mode feedback control circuit of claim 9, wherein the common-mode feedback control circuit further comprises a nineteenth switch and a twentieth switch, one end of the nineteenth switch is connected with the output terminal of the first inverter amplifier, one end of the twentieth switch is connected with the output terminal of the second inverter amplifier, each of other end of the nineteenth switch and other end of the twentieth switch is connected with the common-mode reference voltage, to constitute an auxiliary common-mode feedback circuit.

* * * * *